US006717480B2

(12) United States Patent
Aikawa et al.

(10) Patent No.: US 6,717,480 B2
(45) Date of Patent: Apr. 6, 2004

(54) MULTIELEMENT OSCILLATOR EMPLOYING HIGHER MODE PLANAR RESONATOR

(75) Inventors: Masayoshi Aikawa, Saga (JP); Fumio Asamura, Saitama (JP); Takeo Oita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/278,144

(22) Filed: Oct. 22, 2002

(65) Prior Publication Data

US 2003/0076185 A1 Apr. 24, 2003

(30) Foreign Application Priority Data

Oct. 23, 2001 (JP) .................................. 2001-325293

(51) Int. Cl.[7] ............................. H03B 7/12; H03B 7/14
(52) U.S. Cl. ................ 331/107 P; 331/96; 331/107 DP; 331/107 G; 331/107 SL
(58) Field of Search ................ 331/46, 56, 96, 331/107 P, 107 DP, 107 G, 107 SL, 117 D (56) References Cited

U.S. PATENT DOCUMENTS 3,702,445 A * 11/1972 Forterre .................. 331/107 G

* cited by examiner

Primary Examiner—David Mis
(74) Attorney, Agent, or Firm—Katten Muchin Zavis Rosenman (57) ABSTRACT

A multielement oscillator employing a higher mode planar resonator being provided with the planar resonator and a plurality of oscillating elements. The planar resonator has a substrate, a resonation circuit conductor provided on a first principal plane of the substrate, a grounded circuit conductor provided on a second principal plane of the substrate, and being provided with a high-order resonance mode due to an electric field generating between paired plurality of positive and negative potential points and a magnetic field associated with the electric field. The oscillating elements are being connected, in at least one principal plane of the first and second principal planes of the substrate, to a plurality of identical potential points of the planar resonator so as to provide connection between paired circuit conductor portions formed in the one principal plane.

20 Claims, 9 Drawing Sheets

MULTIELEMENT OSCILLATOR EMPLOYING HIGHER MODE PLANAR RESONATOR

BACKGROUND OF THE INVENTION

1. Field of the Invention

The present invention relates to a multielement oscillator employing a higher mode planar resonator and used as a high-frequency oscillator in the millimeter band and microwave band, and more particularly to a multielement oscillator in which the performance is enhanced by increasing oscillating output.

2. Description of the Related Art

A high-frequency oscillator employing a planar resonator has been used as an oscillating source of frequencies in various units and apparatuses used in radio communication and an optical transmission system. One of this type of high-frequency oscillators is a multielement oscillator employing a higher mode planar resonator. This oscillator has a plurality of oscillating elements such as negative resistance devices and permitting the planar resonator to resonate at the higher mode to obtain an oscillating output. The multielement oscillator employing the higher mode planar resonator has drawn notice because it can be relatively easy in its design compared with an oscillator, in which a fundamental mode of the planar resonator is adapted, and can obtain a large oscillating output. This type of multielement oscillator has been referred to in, for example, ITE technical Report, Vol. 25, No. 6, pp. 15–18.

Figure 1A:
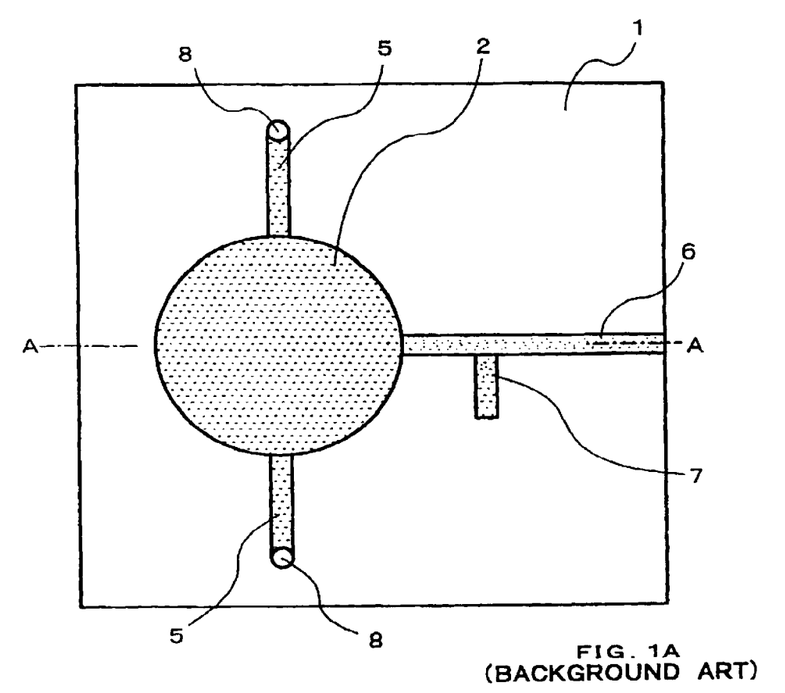
FIG. 1A is a plan view illustrating an example of the conventional multielement oscillator.
Figure 1B:
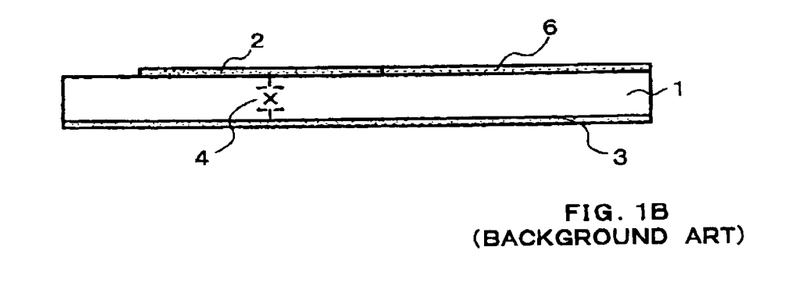
FIG. 1B is a cross-sectional view taken along the line A—A in FIG. 1A.

FIGS. 1A and 1B illustrate the constitution of a conventional multielement oscillator. The multielement oscillator is constituted by a higher mode planar resonator and a plurality of oscillating elements. The planar oscillator is a microstrip line resonator constituted by providing circuit conductor 2 for resonation on one of the principal planes of a substrate 1 consisting of, for example, dielectric material and by providing grounded conductor 3 on substantially the whole face of the other principal plane of substrate 1. Hereinafter, circuit conductor 2 for resonation will be referred to as resonating conductor 2.

Resonating conductor 2 has a substantially circular flat shape. Now, the higher mode made to be the $TM_{21}$ mode having two pair of positive (+) and negative (−) potential points which are paired potential antinodes and arranged at positions in the outer circumference of resonating conductor 2 is applied to the planar resonator. In this case, the adjacent positive and negative potential points are disposed to be shifted 90 degrees to each other viewing from the center of resonating conductor, and identical electric potential points of respective of the positive and negative potential points are disposed at positions where they are mutually in a point symmetry. It should be noted that in the microstrip line type planar resonator, resonant electromagnetic field is generated by an electric field occurring between resonating conductor 2 and grounded conductor 3, and magnetic field according to this electric field.

As the oscillating elements, for example, Gunn diode 4 functioning as a negative resistance device is employed. On one of the principal planes of substrate 1, coupling lines 5 extend, respectively, from two mutually diametrical and identical potential points of resonating conductor 2, and each of coupling lines 5 is provided, at its extreme end, with a through-hole 8. Gunn diode 4 is embedded in each of these two through-holes 8. One and the other of the terminals of Gunn diode 4 are electrically connected to coupling line 5 and grounded conductor 3, respectively, by means of, for example, solder.

Further, on the one principal plane of substrate 1, output line 6 having a microstrip line structure is provided. Output line 6 is connected to resonating conductor at, for example, one of points which have reverse electric potentials to the identical potential points. To output line 6 is connected a capacitive matching line 7 for impedance matching.

In such a multielement oscillator, the oscillation frequency thereof mostly depends on resonance frequency of the planar resonator. Further, in such a multielement oscillator, it can be understood that two high-frequency oscillators sharing the planar resonator are formed so that respective high-frequency oscillators, i.e., Gunn diodes 4 are arranged so as to combine the outputs thereof. Thus, in comparison with the oscillator having only one Gunn diode, the multielement oscillator can nearly double the output thereof.

Nevertheless, the multielement oscillator employing the above-described higher mode constitution must encounter the following problems, caused by its arrangement in which Gunn diodes 4 are embedded in substrate 1 to be connected to coupling lines 5 and grounded conductor 3. That is to say, since the through-holes 8 provided in substrate 1 are formed by mechanical works, the accuracy in the positioning thereof is poor. Thus, the electric symmetry in the planar resonator must be deteriorated while making it difficult to obtain a desired oscillation frequency and further causing unfavored phase shift between the output frequencies from respective oscillating elements, i.e., Gunn diodes 4 to result in reduction in the oscillation output. Furthermore, this type of Gunn diodes 4 generates inductance components when they are mounted, and accordingly an additional reduction in the oscillation output occurs. Moreover, the works of through-holes 8 and embedding of the Gunn diodes in such through-holes for the mounting thereof become causes for lowering mass productivity of the oscillator.

SUMMARY OF THE INVENTION

An object of the present invention is to provide a multielement oscillator employing a higher mode planar resonator, and being superior in its easiness of design and capable of exhibiting a good efficiency in combining the power to thereby exert a large output.

The object of the present invention can be achieved by a multielement oscillator, which comprises: a planar resonator including a substrate, a first circuit conductor for resonation which is provided on a first principal plane of the substrate, and a second circuit conductor for grounding which is provided on a second principal plane of the substrate, the multielement oscillator being provided with a high-order resonance mode due to an electric field between paired plurality of positive and negative potential points and a magnetic field associated with the electric field; and a plurality of oscillating elements respectively connected, in at least one principal plane of the first and second principal planes, to a plurality of identical potential points of the planar resonator so as to be connected to paired circuit conductor portions formed in the one principal plane, wherein the multielement oscillator has an oscillation output corresponding to the high-order resonance mode.

In the present invention, since the oscillating elements are disposed in one of the principal planes of the substrate in which the resonating conductor is formed, so that the oscillating elements are connected between paired circuit conductor portions formed in the one principal plane, there is no need for providing through-holes in the substrate. Therefore, the manufacturing accuracy of the oscillator can be remarkably enhanced while making the working processes thereof easy, and the electric symmetry of the planar resonator can be maintained. Further, the inductance component of each oscillation element when it is mounted can be reduced. Accordingly, in accordance with the present invention, a multielement oscillator can be provided, which employs a higher mode planar resonator capable of improving efficiency in combining the power even in the band of ultrahigh frequency such as millimeter band, to thereby exert a large output.

DETAILED DESCRIPTION OF THE INVENTION

Figure 2A:
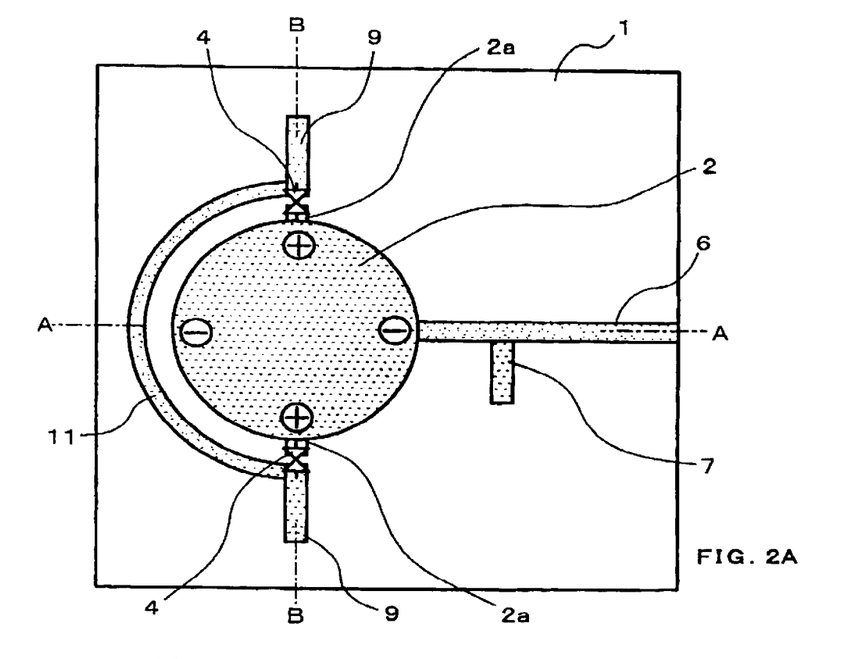
FIG. 2A is a plan view illustrating a multielement oscillator according to a first embodiment of the present invention.
Figure 2B:
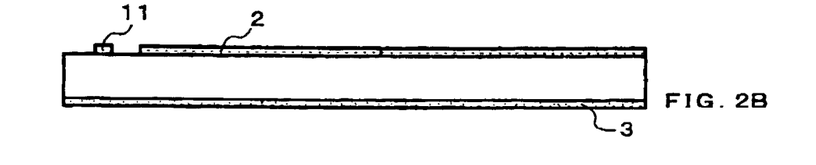
FIG. 2B is a cross-sectional view taken along the line A—A of FIG. 2A.
Figure 2C:
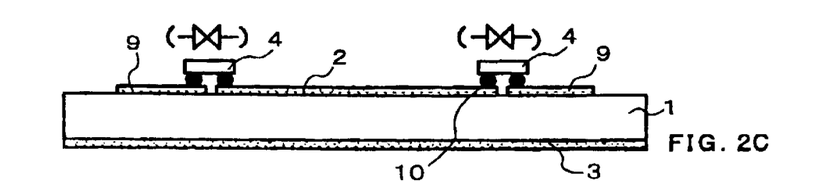
FIG. 2C is a cross-sectional view taken along the line B—B of FIG. 2A.

A multielement oscillator of the first embodiment of the present invention, illustrated in FIGS. 2A through 2C is provided with a higher mode planar resonator and a plurality of oscillating elements. The planar resonator is a microstrip line type resonator constituted by resonating conductor 2 that is a circuit conductor for resonation, provided on one of the principal planes of substrate 1 made of dielectric material or the like, and having a substantially circular flat shape, and grounded conductor 3 provided on substantially the whole surface of the other principal plane of substrate 1. The planar resonator is used at a higher mode of a $TM_{21}$ mode having two positive identical potential points and two negative identical potential points, which are electric potential antinodes, located at positions adjacent to the outer circumference of resonating conductor 2. The planar resonator is provided, as oscillating elements, with Gunn diodes 4, which are negative resistance devices.

In the one principal plane of substrate 1, microstrip line type circuit conductors 9, which are paired with resonating conductor 2 are formed at positions adjacent to identical potential points of wave that are located adjacent to the outer circumference of resonating element 2. The identical potential points are indicated by (+) in the drawing. Circuit conductors 9 extend in a radial direction of resonating conductor 2. Between the respective identical potential points of resonating conductor 2 and one end of the respective circuit conductors 9, there are arranged a Gunn diode 4, respectively, and thus, the opposite ends of each Gunn diode 4 connect the associated identical potential point to the one end of circuit conductor 9. However, matching lines 2 extending from the body of resonating conductor 2 are provided for establishing impedance matching between resonating conductor 2 and each Gunn diode 4, and in fact the terminal of each Gunn diode 4 arranged on the side adjacent to resonating conductor 2 is connected to this matching line 2a.

When the wavelength corresponding to the resonance frequency of this planar resonator is defined as λ, circuit conductor 9 is set to have the length thereof, which is of approximately λ/4, so as to act as an electric short-circuited terminal in the region of high-frequency when it is viewed from the connecting point thereof to Gunn diode 4. Gunn diodes 4 are, as surface-mounted elements, connected to resonating conductor 2 and circuit conductors 9 by ultrasonic thermo-compression bonding using bumps 10 or by mere thermo-compression bonding.

Further, on the one principal plane of substrate 1, there is provided line 11 in a microstrip line structure, which is arranged so as to provide mutual connection between connecting points of both circuit conductors 9 to Gunn diodes 4, and is further arranged to extend along a half circle of the outer periphery of resonating conductor 2. Further, output line 6 in the microstrip line structure is derived, in the manner identical with that shown in FIGS. 1A and 1B, from the point that is reverse potential point to the identical potential point and is located in the region of a half circle of resonating conductor 2 which is different from the half circle thereof adjacent to which line 11 is provided. To output line 6, capacity matching line 7 is connected. Here, a point that is reverse in its potential to the identical potential point in the wave is referred to as a reverse potential point and is indicated by (−) in the drawing.

In order to apply an adequate direct current bias voltage to Gunn diodes 4, an electric source for applying direct current voltage between resonating conductor 2 and grounded conductor 3 is provided although not shown in the drawing.

According to the described arrangement, since Gunn diodes 4 are connected between circuit conductors 9 of approximately λ/4 length and two identical potential points generating in the outer circumference of resonating conductor 2, two high-frequency oscillators sharing the planar resonator in the same manner as that of FIGS. 1A and 1B are created, and the oscillation frequency thereof depends on the planar resonator while substantially doubling the oscillating output, in comparison with any oscillator having only one Gunn diode.

Further, since Gunn diodes 4 are disposed and mounted on one of the principal planes of substrate 1 having resonating conductor 2, it is not necessary to provide any through-hole 8 as provided in the conventional art, and therefore, surface mounting type devices may be adopted. Therefore, it is possible to increase accuracy in the mounting positions of Gunn diodes 4 to thereby accurately maintain the electric symmetry of the planar resonator. Hereby, the phases of the output frequencies from the respective Gunn diodes 4 coincide with one another, and accordingly the efficiency in combining the power can be increase so as to realize good combining of the power. Also, inductance component upon being mounted is reduced to thereby reduce transmission loss and increase the oscillation output.

Figure 3A:
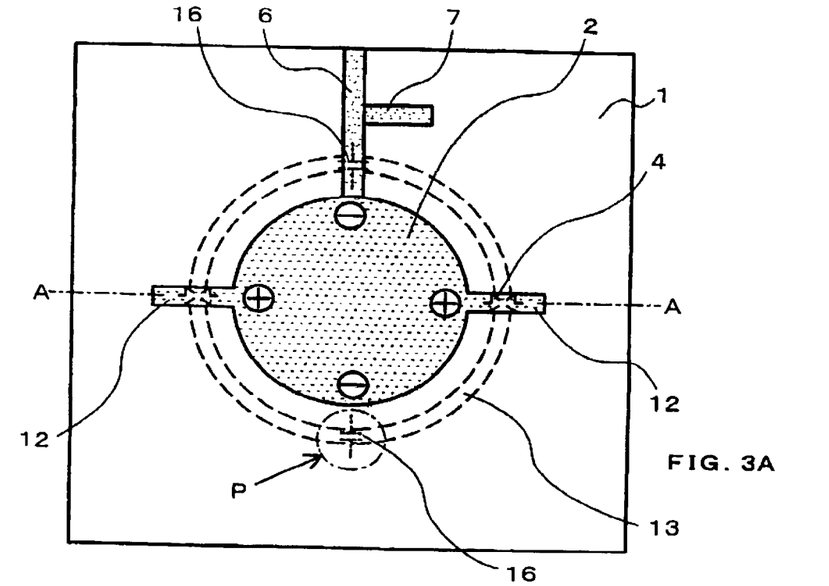
FIG. 3A is a plan view illustrating a multielement oscillator according to a second embodiment of the present invention.
Figure 3B:
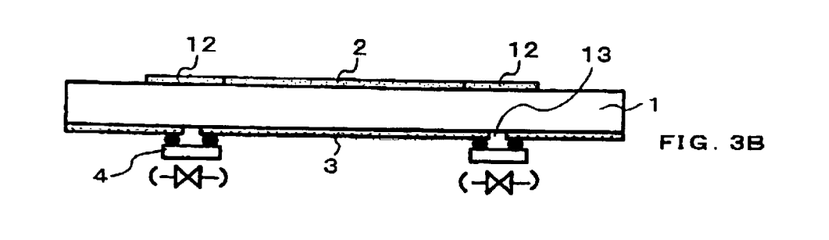
FIG. 3B is a cross-sectional view taken along the line A—A of FIG. 3A.
Figure 3C:
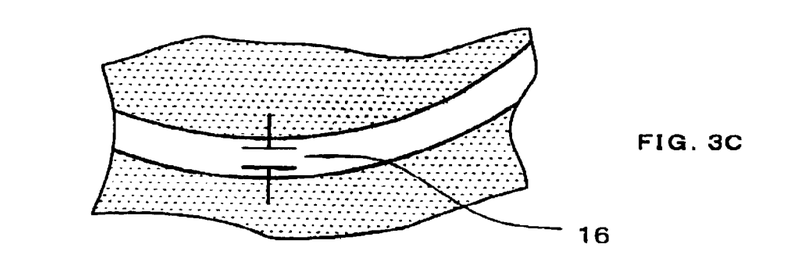
FIG. 3C is an enlarged view of a portion indicated by an arrow P in FIG. 3A, when it is viewed from the bottom side.

Next, a description of a multielement oscillator employing a higher mode planar resonator according to the second embodiment of the present invention will be provided. In FIGS. 3A and 3B illustrating the multielement oscillator of the second embodiment, the same constituents as those in FIGS. 2A and 2B are designated by the same reference numerals, and the redundant description of these constituents will not be repeated.

In the multielement oscillator of the second embodiment, microstrip line type lead-out lines 12 having electrically open ends are connected to identical potential points of substantially circular resonating conductor 2 provided on one of the principal planes of substrate 1. On the other principal plane of substrate 1, grounded conductor 3 is provided, and an annular groove (i.e., an opening portion) is formed in grounded conductor 13 so as to cross lead-out lines 12. This groove functions as a ring-like slot line 13 and is electromagnetically coupled to lead-out lines 12 via substrate 1. Annular slot line 13 is arranged to be concentric with resonating conductor 2, and the inner diameter thereof is formed to be larger than the outer diameter of resonating conductor 2.

Further, at the positions immediately under lead-out lines 12, Gunn diodes 4 are arranged on slot line 13, and Gunn diodes 4 are surface-mounted so as to provide connection between conductor portions on both sides of slot line 13 in the other principal plane. At this stage, similarly to the first embodiment, output line 6 having matching line 7 is formed so as to extend from one of the reverse potential points of resonating conductor 2 on the one principal plane of substrate 1. on slot line 13 immediately under output line 6 is mounted chip capacitor 16 to form an output transmission channel. In this case, in order to maintain the symmetry of resonation mode, another chip capacitor may be mounted on the point on slot line 13, which corresponds to the other reverse potential point.

Further, in the multielement oscillator of the present embodiment, a non-illustrated direct current power supply is provided to apply direct current bias voltage to Gunn diodes 4.

In accordance with the described arrangement, lead-out lines 12 and slot line 13 connected to the two identical potential points of resonating conductor 2 are electromagnetically coupled to one another, and at the intersecting positions of both, Gunn diodes 4 are connected between circuit conductor portions on both sides of slot line 13. Thus, similarly to the first embodiment, two high-frequency oscillators sharing the planar resonator are constituted. Accordingly, the oscillation frequency of the oscillator depends on the planar resonator, and can deliver approximately doubled oscillating output in comparison with the case where only one single Gunn diode is employed.

Further, since Gunn diodes 4 are arranged on the other principal plane of substrate 1 so as to be mounted between paired circuit conductor portions on that principal plane, similarly to the first embodiment, surface-mounting type devices may be adopted as Gunn diodes 4. Therefore, it is possible to increase the accuracy in the mounting positions of Gunn diodes 4 so as to precisely maintain the electric symmetry of the planar resonator. Hereby, the phases of output frequencies from respective oscillating elements, i.e., from Gunn diodes, coincide with one another while enabling it to achieve good combining of the power. In addition, since the inductance component upon being mounted can be reduced, the oscillating output can be further increased.

Figure 4A:
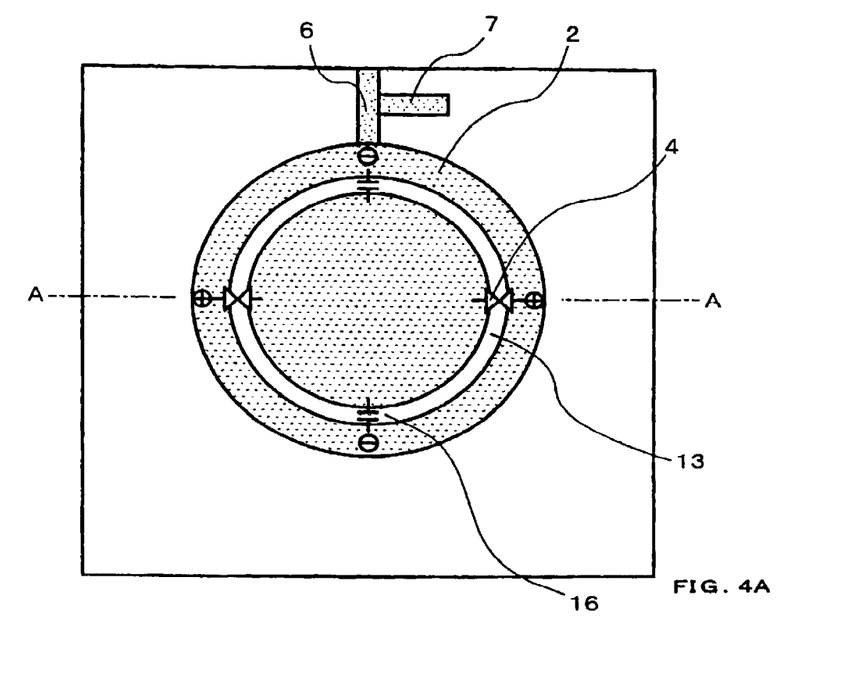
FIG. 4A is a plan view illustrating a multielement oscillator according to a third embodiment of the present invention.
Figure 4B:
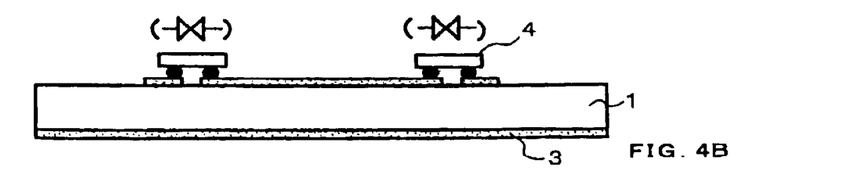
FIG. 4B is a cross-sectional view taken along the line A—A of FIG. 4A.

Now, a description of a multielement oscillator employing a higher mode planar resonator, according to the third embodiment of the present invention will be provided below, with reference to FIGS. 4A and 4B.

Although the multielement oscillator of the third embodiment is similar to the multielement oscillator of the first embodiment, a large difference resides in that slot line 13 is disposed within resonating conductor 2. In the multielement oscillator of the third embodiment, substantially circular resonating conductor 2 provided on one of the principal planes of substrate 1 is provide with a ring-like groove, i.e., an opening portion formed therein, and this opening portion forms annular slot line 13. In the whole surface of the other principal planes of substrate 1, grounded conductor 3 is formed. At two identical potential points disposed in the outer circumferential portion of resonating conductor 2 so as to be mutually opposed, Gunn diodes 4 are arranged respectively. Gunn diodes 4 are provided by the surface-mounting manner so as to provide electric connection between conductors on both sides of slot line 13. From one of the reverse potential points, output line 6 having matching line 7 is derived. In order to maintain the symmetry of the resonation electromagnetic field, chip capacitors 16 may be mounted on slot line 13 at the positions of the respective reverse potential points.

In accordance with the described arrangement, since Gunn diodes 4 are connected between paired circuit conductor portions located adjacent to the two identical potential points of resonating conductor 2, similarly to the aforedescribed embodiment, two high-frequency oscillators sharing the planar resonator are provided. Therefore, the oscillation frequency thereof depends on the planar resonator and can acquire approximately doubled oscillating output in comparison with the case where only one single Gunn diode is employed.

Further, since Gunn diodes 4 are disposed on one of the principal planes of substrate 1 so as to be mounted between paired circuit conductors on that principal plane, surface-mounting type devices may be adopted as Gunn diodes 4, similarly to the first embodiment. Therefore, accuracy in the mounting and positioning of Gunn diodes 4 can be increased so as to precisely maintain the electric symmetry of the planar resonator to thereby enable it to achieve good combining of the power and reduce inductance components upon being mounted. Thus, it is possible to further increase the oscillating output.

Figure 5A:
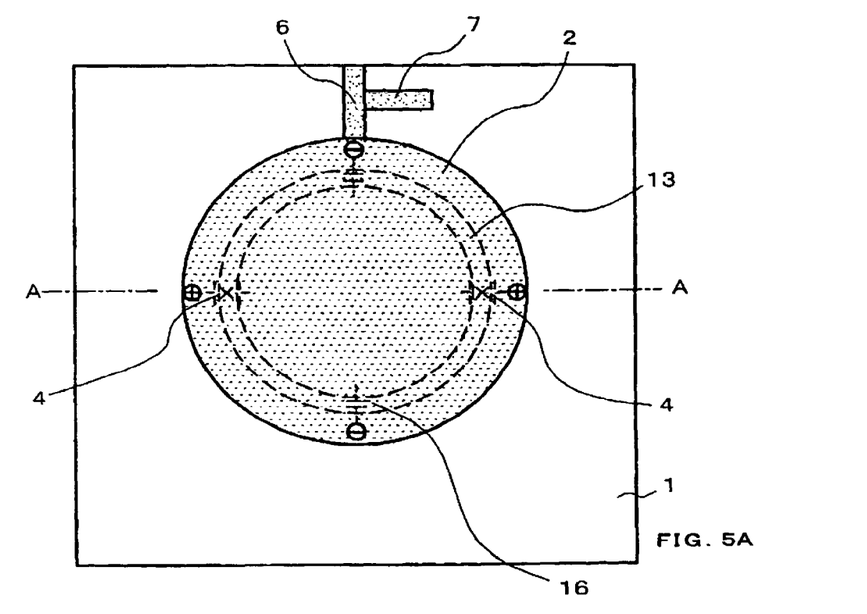
FIG. 5A is a plan view illustrating a multielement oscillator according to a fourth embodiment of the present invention.
Figure 5B:
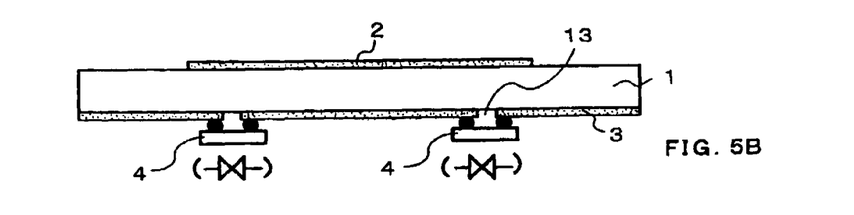
FIG. 5B is a cross-sectional view taken along the line A—A of FIG. 5A.

Next, a description of a multielement oscillator employing a higher mode planar resonator according to the fourth embodiment of the present invention will be provided below, with reference to FIGS. 5A and 5B.

The multielement oscillator of the fourth embodiment is similar to that of the second embodiment. However, a large difference resides in that the outer diameter of slot line 13 formed in the other principal plane of substrate 1 is smaller than the outer diameter of resonating conductor 2. Namely, in the multielement oscillator of the fourth embodiment, output line 6 having matching line 7 is formed in one of the principal planes of substrate 1 so as to extend from one of the reverse potential points of substantially circular resonating conductor 2. In the other principal plane of substrate 1, grounded conductor 3 is provided in a manner such that an annular groove, i.e., an opening portion is formed in grounded conductor 3. This groove functions as slot line 13, and is electromagnetically connected to resonating conductor 2 via substrate 1. Slot line 13 is disposed to be concentric with resonating conductor 2, and the outer diameter of slot line 13 is made smaller than that of resonating conductor 2.

Further, on the other principal plane of substrate 1, Gunn diodes 4 are disposed on slot line 13 at positions corresponding to identical potential points in the outer circumference of resonating conductor 2. These Gunn diodes 4 are provided by the surface-mounting manner so as to provide connection between paired conductor portions on both sides of slot line 13. In this case, in order to maintain the symmetry of the resonating electromagnetic field, chip capacitors 16 may be mounted on slot line 13 at the positions adjacent to the reverse potential points of resonating conductor 2 on the other principal plane of substrate 1.

Due to the described constitution, since Gunn diodes 4 are connected between the paired circuit conductor portions on the other principal plane at the positions corresponding to the two identical potential points of resonating conductor 2, similarly to the afore-described respective embodiments, two high-frequency oscillators sharing the planar resonator are provided, and thus in comparison with the case of using only one single Gunn diode, approximately doubled oscillating output can be acquired. Also, since surface-mounting type Gunn diodes 4 are mounted on the other principal plane, electric symmetry of the planar resonator can be precisely maintained to enable it to achieve good combining of the power. In addition, since the inductance component upon being surface mounted can be reduced so as to further increase the oscillating output.

Figure 6A:
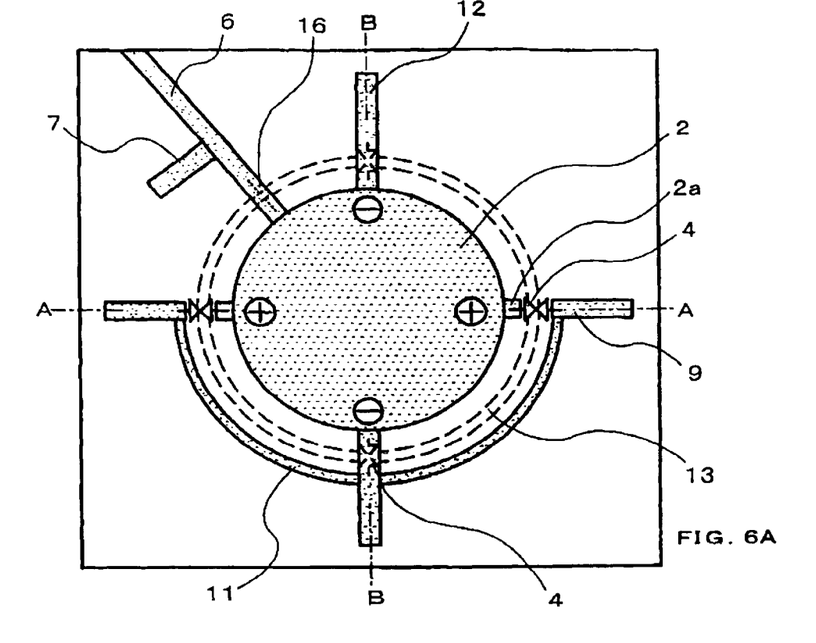
FIG. 6A is a plan view illustrating a multielement oscillator according to a fifth embodiment of the present invention.
Figure 6B:
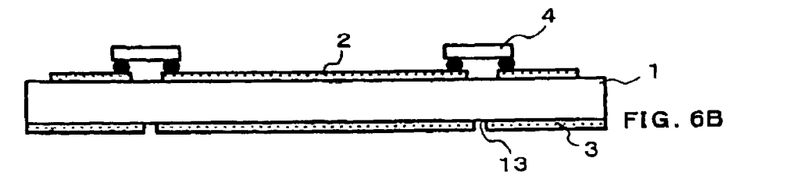
FIG. 6B is a cross-sectional view taken along the line A—A of FIG. 6A.
Figure 6C:
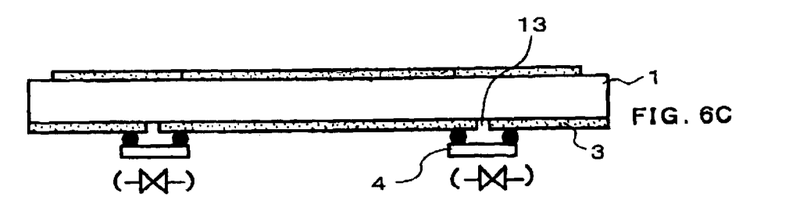
FIG. 6C is a cross-sectional view taken along the line B—B of FIG. 6A.

Next, a multielement oscillator employing a higher mode planar resonator according to the fifth embodiment of the present invention will be provided below, with reference to FIGS. 6A through 6C.

In the described respective embodiments, Gunn diodes 4 that are oscillating elements are disposed so as to correspond to the identical potential points of the planar resonator. However, in the fifth embodiment, Gunn diodes are connected to positions corresponding to not only the identical potential points but also the reverse potential points, and therefore, the constitution of this embodiment can be understood as a combination of the multielement oscillators of the first embodiment and that of the second embodiment.

In one of the principal planes of substrate 1, microstrip line type circuit conductors 9, which are paired with resonating conductor 2, are formed to come close to the two identical potential points located adjacent to the outer circumference of resonating conductor 2, and extend in radial directions of resonating conductor 2. Between respective identical potential points of resonating conductor 2 and one end of respective circuit conductors 9, Gunn diodes 4 are connected, respectively. Thus, both ends of each Gunn diode 4 provide a connection between the identical potential point and one end of circuit conductor 9. Microstrip line type lead-out lines 12 are formed to extend from the reverse potential points located at two positions close to the outer circumference of resonating conductor 2. Further, in the one principal plane of substrate 2, line 11 of the microstrip line structure is provided so as to provide mutual connection between connecting points of both circuit conductors 9 to Gunn diodes 4, and so as to be formed along one half of the outer periphery of resonating conductor 2. Also, with the remaining half outer periphery of resonating conductor 2, which is not provided with line 11, output line 6 having matching line 7 is derived from an intermediate point between the identical and reverse potential points.

On the other hand, on the other principal plane of substrate 1, there is provided grounded conductor 3, and an annular groove (an opening portion) is formed in grounded conductor 3 so as to cross lead-out lines 12. This groove functions as ring-like slot line 13 and is electromagnetically connected to lead-out Lines 12 via substrate 1. Although slot line 13 is arranged to be concentric with resonating conductor 2, the inner diameter thereof is larger than the outer diameter of resonating conductor 2. Further, at the position immediately under lead-out line 12, Gunn diodes 4 are arranged and mounted on slot line 13. These Gunn diodes 4 are surface-mounted so as to provide connection between conductor portions on both sides of slot line 13. Also, in the other principal plane of substrate 1, chip capacitor 16 is mounted on slot line 13 at the position immediately under output line 6 so as to form a transmission channel as described before.

In accordance with the described constitution, to both the two identical potential points of the planar resonator and the two reverse potential points against the former points, i.e., to the total four points, Gunn diodes 4 are connected, respectively, and an oscillating output which is the sum of the oscillating outputs from these Gunn diodes 4 can be acquired. Thus, in comparison with the case of using only one single Gunn diode 4, approximately quadrupled output can be acquired. Further, similarly to the afore-described respective embodiments, good combining of the power can be achieved, and generation of inductance component is suppressed to further increase the oscillating output.

Figure 7A:
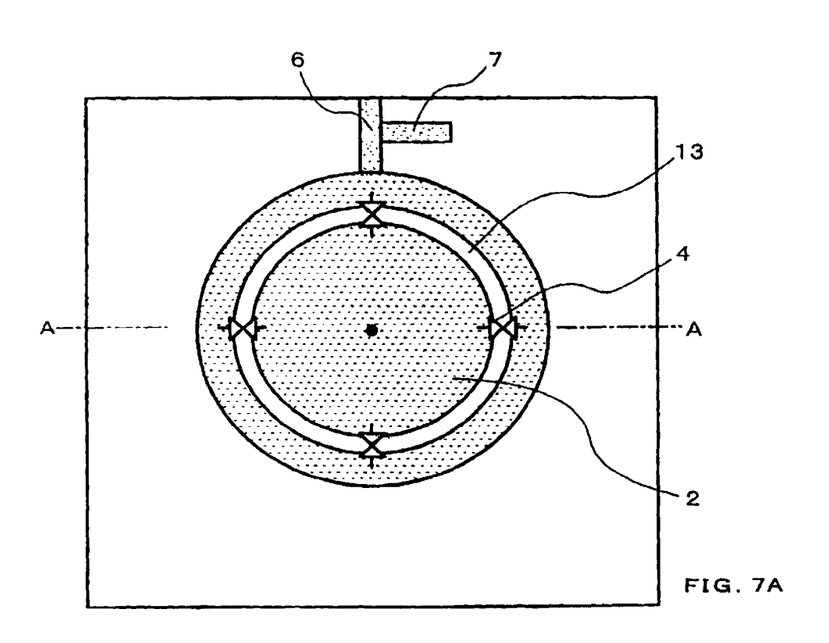
FIG. 7A is a plan view illustrating a multielement oscillator according to a sixth embodiment of the present invention.
Figure 7B:
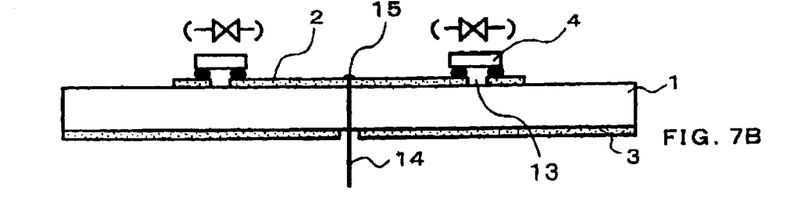
FIG. 7B is a cross-sectional view taken along the line A—A of FIG. 7A.

Now, a description of a multielement oscillator employing a higher mode planar resonator according to the sixth embodiment will be provided below, with reference to FIGS. 7A and 7B.

The multielement oscillator of the sixth embodiment is similar, in its construction, to the multielement oscillator of the third embodiment. However, there is a difference in that the injection locking is used to enhance stability of an oscillating frequency. For that reason, as a resonance mode of the planar resonator, for example, a higher mode of $TM_{01}$ mode is employed in the sixth embodiment, instead of $TM_{21}$ mode used by the afore-described respective embodiments. $TM_{01}$ mode is a resonance mode in which concentric circle-like resonating electromagnetic fields exist with respect to the center of the planar resonator.

In the multielement oscillator of the sixth embodiment, substantially circular resonating conductor 2 provided on one principal plane of substrate 1 is provided, formed therein, with slot line 13 as illustrated in connection with, for example, the third embodiment. Further, on slot line 13, Gunn diodes 4 are arranged so as to correspond to respective of points by which the outer periphery of resonating conductor 2 is equally divided, i.e., in the illustrated example, the points that make a quadrisection of the outer periphery. Each of Gunn diodes 4 provides connection between the conductor portions on both sides of slot line 13. Also, to resonating conductor 2 is connected output line 6 having matching line 7 and an oscillating output is derived from this output line 6.

On substantially the whole face of the other principal plane of substrate 1, there is provided grounded conductor 3, and a portion thereof located at a position corresponding to the center of resonating conductor 2 is cut off. At that position where grounded conductor 3 is cut off, inner conductor 14 of, for example, a coaxial line pierces through substrate 1 from the other principal plane side and is connected to resonating conductor 2 by means of solder 15 or the like. Although not illustrated here, the outer conductor of the coaxial line is connected to grounded conductor 3. Instead of directly connecting inner conductor 14 of the coaxial line to resonating conductor 2, a via hole connected to the center of resonating conductor 2 may be formed in substrate 1, so that inner conductor 14 is connected to this via hole. In this multielement oscillator, when the resonation frequency of resonating conductor 2, that is, oscillating frequency, is defined as $f_0$, and when "n" is defined as a natural number, a synchronizing signal having the frequency of $f_0/n$ is injected from the coaxial line into resonating conductor 2. Generally, setting is conducted so that n>1 is established.

Due to this constitution, the planar resonator makes synchronization at every n number of the waveform of the resonating frequency in response to the application of the synchronizing signals, and accordingly the frequency stability of the oscillation frequency can be enhanced. Therefore, the phase characteristic due to combining of a plurality of oscillating outputs by the respective Gunn diodes 4 is improved so as to reduce any phase noise. In this example, $TM_{01}$ mode is used for the resonation mode of the planar resonator, and the synchronizing injection is applied to the center of that mode. Thus, the symmetry of the resonation mode is well maintained.

At this stage, a fear of deterioration in the characteristic based on the provision of via hole in substrate 1 and connection of inner conductor 14 piercing through substrate 1 to resonating conductor 2 might occur. Nevertheless, since the synchronizing signal has the frequency which is generally lower than the resonation frequency, the oscillator can avoid receipt of any adverse affect from an inductance due to the connection of the inner conductor and the provision of the via hole. Therefore, no problem occurs by the exertion of the injection synchronization.

Although the preferred embodiments of the present invention have been described hereinbefore, it is to be understood that the present invention is not limited to the described embodiments.

Figure 8:
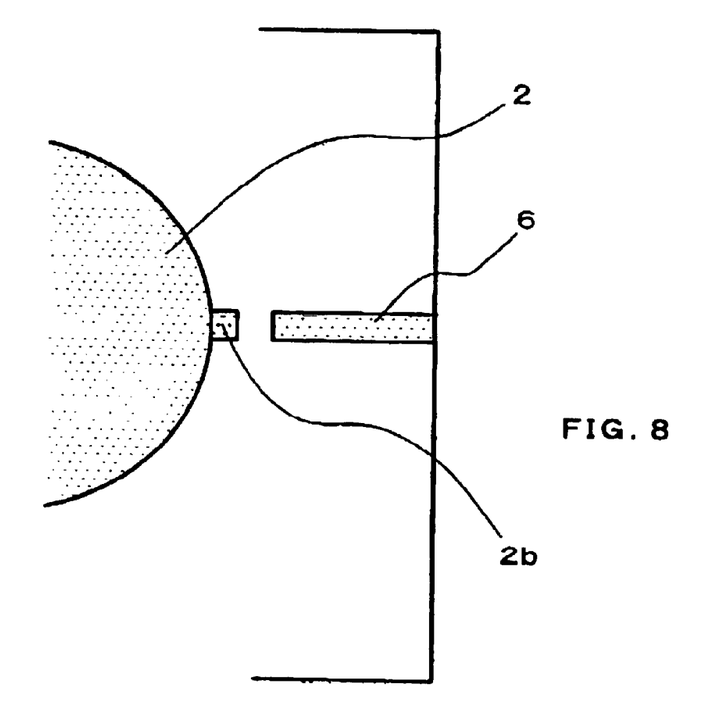
FIG. 8 is a partial plan view illustrating a multielement oscillator according to another embodiment of the present invention; and, FIG. 9 is a plan view illustrating a multielement oscillator according to a further embodiment of the present invention.

In the foregoing respective embodiments, although output line 6 having matching line 7 is connected to resonating conductor 2 to derive an oscillating output, as illustrated in FIG. 8, resonating conductor 2 may be provided with tab 2b to which output line 6 is coupled by the capacitive coupling, so as to provide a loose coupling between resonating conductor 2 and output line 6 to thereby obtain an oscillating output. In this case, since the degree of coupling between tab 2b and output line 6 may be controlled by the capacitance value between both, it is not necessary to provide output line 6 with any matching line 7.

Figure 9:
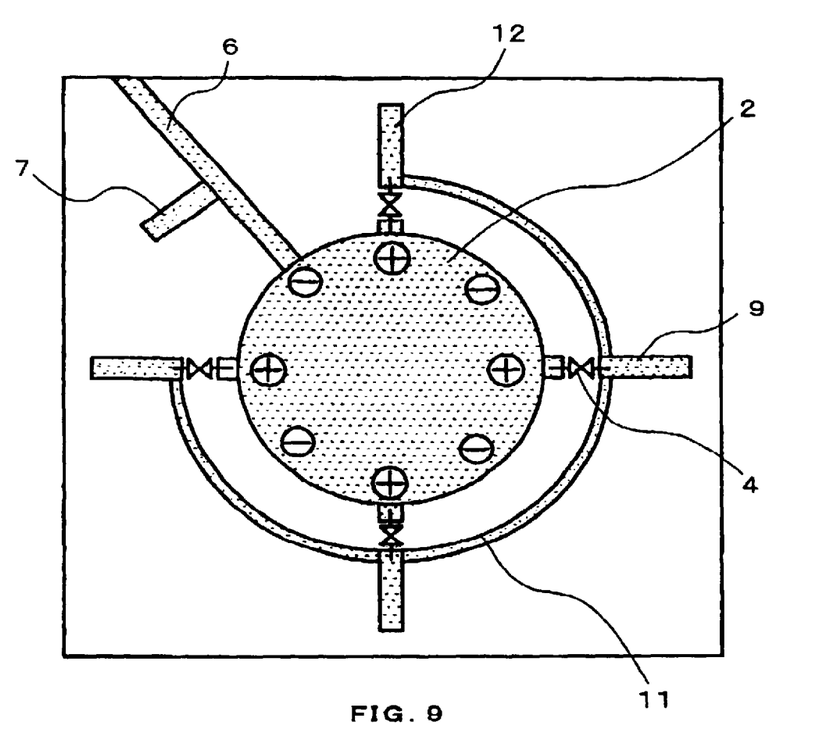

In the first through fifth embodiments, as the high-order resonance mode of the planar resonator, $TM_{21}$ mode is used. However, the order of the resonance mode is not limited to that $TM_{21}$ mode. For example, as illustrated in FIG. 9, $TM_{41}$ mode might be used as the resonance mode, and Gunn diodes 4 may be connected to four identical potential points in the outer circumference of substantially circular resonating conductor 2. In this case, in comparison with the case where one single Gunn diode is used, approximately quadrupled oscillating output may be acquired. Furthermore, when Gunn diodes are additionally provided at four reverse potential points, approximately eight times of oscillating output may be acquired compared with the case where one single Gunn diode is used. Thus, a higher mode generally represented by $TM_{01}$ may be eventually used in the present invention.

Further, in the respective embodiments, the Gunn diode functioning as a negative resistance device is adopted as an oscillating element. However, without being limited to this element, amplifying elements such as transistors and FETs (field effect transistors) may be employed. In conclusion, the oscillating elements adopted may be sufficient enough if they could be oscillating elements including a circuit and constituting a high-frequency oscillator in cooperation with the planar resonator.

What is claimed is:

1. A multielement oscillator comprising:

a planar resonator including a substrate, a first circuit conductor for resonation which is provided on a first principal plane of said substrate, and a second circuit conductor for grounding which is provided on a second principal plane of said substrate, said planar resonator being provided with a high-order resonance mode by an electric field between paired plurality of positive and negative potential points and a magnetic field associated with said electric field; and a plurality of oscillating elements respectively connected, in at least one principal plane of said first and a second principal planes, to a plurality of identical potential points, so as to provide connection between paired circuit conductor portions formed in said one principal plane;

wherein said multielement oscillator has an oscillating output corresponding to said high-order resonance mode.

2. The multielement oscillator according to claim 1, further comprising:

a third circuit conductor of a microstrip line structure which is provided on said first principal plane and acts as an electric short-circuited end in a region of high-frequency when the third circuit conductor is viewed from one end thereof, wherein said paired circuit conductor portion comprises a portion of said first circuit conductor and a portion of said third circuit conductor.

3. The multielement oscillator according to claim 2, wherein said first circuit conductor has a substantially circular plane shape.

4. The multielement oscillator according to claim 3, comprising a line arranged to extend along an outer periphery of said first circuit conductor on the said first principal plane so as to provide mutual connection between one ends of said third circuit conductors.

5. The multielement oscillator according to claim 4, further comprising an output line connected to said first circuit conductor to derive said oscillating output.

6. The multielement oscillator according to claim 1, further comprising:
   a third circuit conductor of a microstrip line structure which is provided on said first principal plane and connected to an identical potential point of said first circuit conductor; and
   a slot line which is electromagnetically coupled to said third circuit conductor and formed in said second circuit conductor,
   wherein said paired circuit conductor portions comprises conductor portions on both sides of said slot line.

7. The multielement oscillator according to claim 6, wherein said first circuit conductor has a substantially circular plane shape, and said slot line is arranged to be concentric with said first circuit conductor.

8. The multielement oscillator according to claim 7, further comprising an output line connected to said first circuit conductor to derive said oscillating output.

9. The multielement oscillator according to claim 1, further comprising a slot line formed in said second circuit conductor, wherein said paired circuit conductor comprises conductor portions arranged on both sides of said slot line.

10. The multielement oscillator according to claim 9, wherein said first circuit conductor has a substantially circular plane shape, and said slot line is arranged to be concentric with said first circuit conductor.

11. The multielement oscillator according to claim 1, further comprising a slot line which is electromagnetically coupled to said first circuit conductor and formed in said second circuit conductor, wherein said paired circuit conductor comprises conductor portions arranged on both sides of said slot line.

12. The multielement oscillator according to claim 11, wherein said first circuit conductor has a substantially circular plane shape, and said slot line is arranged to be concentric with said first circuit conductor.

13. The multielement oscillator according to claim 1, further comprising:
   a third circuit conductor of a microstrip line structure which is provided in said first principal plane to be located adjacent to said identical potential point and acts as an electric short-circuited end in a region of high-frequency when said third circuit conductor is viewed from one end thereof; and
   a slot line which is electromagnetically coupled with said third circuit conductor and formed in said second circuit conductor,
   wherein said paired circuit conductor portions comprise a portion of said first circuit conductor and a portion of said third circuit conductor, and
   said multielement oscillator further comprises a second oscillating element arranged to correspond to reverse potential point in said first circuit conductor and providing connection between conductor portions on both sides of said slot line.

14. The multielement oscillator according to claim 13, wherein said first circuit conductor has a substantially circular plane shape, and said slot line is arranged to be concentric with said first circuit conductor.

15. The multielement oscillator according to claim 14, comprising a line arranged to extend along an outer periphery of said first circuit conductor on the said first principal plane so as to provide mutual connection between one ends of said third circuit conductors.

16. The multielement oscillator according to claim 1, wherein said first circuit conductor has a $TM_{21}$ mode as a resonance mode.

17. The multielement oscillator according to claim 1, wherein said first circuit conductor has a $TM_{41}$ mode as a resonance mode.

18. The multielement oscillator according to claim 1, further comprising a means for injecting a synchronizing signal having a frequency of $f_0/n$, where resonance frequency of said planar resonator of said high-order resonance mode is $f_0$, and n is a natural number.

19. The multielement oscillator according to claim 18, wherein said first circuit conductor has a substantially circular plane shape, and said synchronizing signal is injected at a center position of said first circuit conductor.

20. The multielement oscillator according to claim 1, wherein each of said oscillating elements is a Gunn diode.

* * * * *